United States Patent
Hu et al.

(10) Patent No.: US 10,215,820 B2
(45) Date of Patent: Feb. 26, 2019

(54) DIFFERENTIATING TISSUES WITH MR IMAGING

(71) Applicant: KONINKLIJKE PHILIPS N.V., Eindhoven (NL)

(72) Inventors: Lingzhi Hu, Cleveland, OH (US); Christian Stehning, Hamburg (DE); Zhiqiang Hu, Twinsburg, OH (US); Lingxiong Shao, Saratoga, CA (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 357 days.

(21) Appl. No.: 14/905,880

(22) PCT Filed: Jul. 2, 2014

(86) PCT No.: PCT/IB2014/062787
§ 371 (c)(1),
(2) Date: Jan. 18, 2016

(87) PCT Pub. No.: WO2015/011584
PCT Pub. Date: Jan. 29, 2015

(65) Prior Publication Data
US 2016/0169994 A1   Jun. 16, 2016

Related U.S. Application Data

(60) Provisional application No. 61/857,259, filed on Jul. 23, 2013.

(51) Int. Cl.
*G01V 3/00* (2006.01)
*G01R 33/48* (2006.01)
(Continued)

(52) U.S. Cl.
CPC ....... *G01R 33/4816* (2013.01); *G01R 33/481* (2013.01); *G01R 33/4828* (2013.01); *G01R 33/5608* (2013.01); *G01R 33/58* (2013.01)

(58) Field of Classification Search
USPC .......................................................... 324/309
See application file for complete search history.

(56) References Cited

U.S. PATENT DOCUMENTS

| | | | | |
|---|---|---|---|---|
| 9,977,106 B2 * | 5/2018 | Nehrke | ................... | G01R 33/50 |
| 2015/0002149 A1 * | 1/2015 | Nehrke | ................ | G01R 33/243 |
| | | | | 324/309 |

(Continued)

OTHER PUBLICATIONS

Gatehouse, et al., "Magnetic Resonance Imaging of Short T2 Components in Tissue", Clinical Radiology, Livingstone, Harlow, GB, vol. 58, No. 1, Jan. 1, 2003.

(Continued)

*Primary Examiner* — Rodney E Fuller (57) ABSTRACT

A medical imaging system (10) includes a magnetic resonance (MR) scanner (12), and a MR reconstruction unit (34). The MR scanner (12) applies a multi-echo ultra-short TE (UTE) with mDixon pulse sequence to a subject (16) and receives MR data (33) representing at least a portion of the subject. The MR reconstruction unit (34) reconstructs a Free Induction Decay (FID) image (120), and one or more echo magnitude images (122), one or more phase images (39), an in-phase image (39), a water image (39), and a fat image (39) from the received MR data (33).

17 Claims, 5 Drawing Sheets

(51) Int. Cl.
G01R 33/56 (2006.01)
G01R 33/58 (2006.01)

(56) References Cited

U.S. PATENT DOCUMENTS

2015/0110374 A1* 4/2015 Traughber ........... G01R 33/481
                                                        382/131
2016/0054416 A1* 2/2016 Stehning ................ A61B 5/055
                                                        600/411
2016/0202334 A1* 7/2016 Stehning .............. G01R 33/481
                                                        324/309

OTHER PUBLICATIONS

J. Rahmer, et al., "Merging UTE Imaging, Water-Fat Separation, and T2 * Mapping in a Single 3D MSK Scan", Proceedings of the International Society for Magnetic Resonance in Medicine, 18th Scientific Meeting and Exhibition, Stockholm, Sweden, vol. 18, Apr. 17, 2010.

Du, et al., "Orientational analysis of the Achilles tendon and enthesis using an ultrashort echo time spectroscopic imaging sequence", Magnetic Resonance Imaging, Elsevier Science, Tarrytown, NY, vol. 28, No. 2, Feb. 1, 2010.

Kang Wang, et al., "k-space water-fat decomposition with T2 * estimation and multifrequency fat spectrum modeling for ultrashort echo time imaging", Journal of Magnetic Resonance Imaging, vol. 31, No. 4, Mar. 29, 2010, pp. 1027-1034.

Jurgen Rahmer, et al., "Selective 3d ultrashort TE imaging: comparison of dual-echo acquisition and magnetization preparation for improving short—T2 contrast", Magnetic Resonance Materials in Physics, Biology and Medicine, Chapman and Hall, vol. 20, No. 2, Mar. 13, 2007.

Hanzhou Yu, et al., "Multiecho reconstruction for simultaneous water-fat decomposition and T2* estimation", Journal of Magnetic Resonance Imaging, vol. 26, No. 4, Jan. 1, 2007.

* cited by examiner

DIFFERENTIATING TISSUES WITH MR IMAGING

CROSS REFERENCE TO RELATED APPLICATIONS

This application is the U.S. National Phase application under 35 U.S.C. § 371 of International Application No. PCT/IB2014/062787, filed Jul. 2, 2014, published as WO 2015/011584 on Jan. 29, 2015, which claims the benefit of U.S. Provisional Patent Application No. 61/857,259 filed Jul. 23, 2013. These applications are hereby incorporated by reference herein.

The following relates generally to medical imaging. It finds particular application in conjunction with magnetic resonance (MR) imaging to provide attenuation correction for positron emission tomography (PET) imaging, and will be described with particular reference thereto. However, it will be understood that it also finds application in other usage scenarios and is not necessarily limited to the aforementioned application.

In PET imaging, a subject is injected with a radiopharmaceutical which targets particular tissues typically through absorption based on a metabolic activity. As the radiopharmaceutical decays, positrons are emitted which annihilate in contact with an electron to form a pair of photons emitted 180° opposite along a line of response (LOR). The emitted gamma photons are recorded by PET detectors surrounding the subject. The location of the annihilation events are computed which provides an image of the tissues targeted by the radiopharmaceutical. The emitted photons are affected by the density of tissues between the point of the annihilation event and the detector by either absorption or deflection. The recorded amount of radiopharmaceutical present in tissue at a specific location is attenuated from the actual amount by the tissue density. Correction for attenuation of PET image data seeks to accurately identify the tissue density at each voxel with an attenuation correction map for the subject being imaged.

Developing attenuation correction maps has been performed with X-ray radiation devices such CT scanners where recorded levels of x-ray radiation used to reconstruct images correlates strongly with tissue density. Newer techniques seek to use magnetic resonance systems which avoid the use of X-ray radiation with the subject. However, magnetic resonance imaging does not inherently differentiate tissue density.

One issue with using magnetic resonance to create attenuation maps for PET imaging includes the lack of accurately differentiating tissue types. Previous efforts have only classified tissues into three classifications: lungs, soft tissue, and air. The classification of tissue at each voxel affects the attenuation correction values assigned for a classified tissue at a location. Broad classifications result in coarse estimates of attenuation, e.g. one value per tissue type. For example, bone tissue includes cortical bone and spongy bone which have different densities. Spongy bone includes bone marrow and is typically highly vascularized which is less dense than cortical bone. The coarse attenuation map adversely affects the resulting accuracy of the attenuation corrected reconstructed PET image.

Another issue with the use of magnetic resonance imaging to classify tissues includes current bone imaging techniques which suffer from deviations in k-space trajectory and can cause image artifacts and lead to erroneous classification of voxels. Causes of trajectory deviations can include eddy currents, delays within the gradient amplifier drivers, and/or receive chain electronics such as clock jitter, etc. The trajectory deviations lead to image artifacts which in turn lead to possible incorrect classification of tissue for a given voxel.

The following discloses a new and improved MR acquisition with retrospective eddy current calibration and processing steps for MR based attenuation correction in PET/MR imaging which addresses the above referenced issues, and others.

In accordance with one aspect, a medical imaging system includes a magnetic resonance (MR) scanner, and a MR reconstruction unit. The MR scanner applies a multi-echo ultra-short TE (UTE) with mDixon pulse sequence to a subject and receives MR data representing at least a portion of the subject. The MR reconstruction unit reconstructs a Free Induction Decay (FID) image, and one or more echo magnitude images, one or more phase images, an in-phase image, a water image, and a fat image from the received MR data.

In accordance with another aspect, a method of medical imaging includes receiving magnetic resonance (MR) data representing at least a portion of a subject based on an applied multi-echo ultra-short TE (UTE) with mDixon pulse sequence to the subject with an MR scanner. A Free Induction Decay (FID) image, and one or more echo magnitude images, one or more phase images, an in-phase image, a water image, and a fat image are reconstructed from the received MR data.

In accordance with another aspect, a medical imaging system includes at least one marker, a magnetic resonance (MR) scanner, an MR reconstruction unit, and an MR calibration unit. At least one marker is magnetically resonant in a magnetic field. The MR scanner receives magnetic resonance data representing at least a portion of the subject with the at least one marker. The MR reconstruction unit reconstructs a Free Induction Decay (FID) image and one or more echo magnitude images from the received MR data. The MR calibration unit compares the FID image and the one or more echo magnitude images and iteratively adjusts reconstruction parameters based on the at least one marker and the k-space trajectory delays and decay times in the reconstructed FID image and the one or more echo magnitude images.

One advantage is reduction in MR artifacts due to eddy currents and other k-space trajectory deviations.

Another advantage resides in the improvement in accuracy of bone tissue classification.

Another advantage includes the use of low cost and simplicity of MR markers to reduce the MR artifacts.

Another advantage resides in improvement in the granularity of tissue classification using magnetic resonance imaging.

Another advantage includes differentiating cortical bone tissue, spongy bone tissue, lung tissue, body soft tissue, body fat tissue, air pockets within the body, and external air by voxel.

Another advantage resides in the improvement in accuracy of the attenuation maps for PET imaging.

Another advantage includes the improvement in accuracy of PET images.

Still further advantages will be appreciated to those of ordinary skill in the art upon reading and understanding the following detailed description.

The invention may take form in various components and arrangements of components, and in various steps and arrangement of steps. The drawings are only for purposes of illustrating the preferred embodiments and are not to be construed as limiting the invention.

Figure 1:
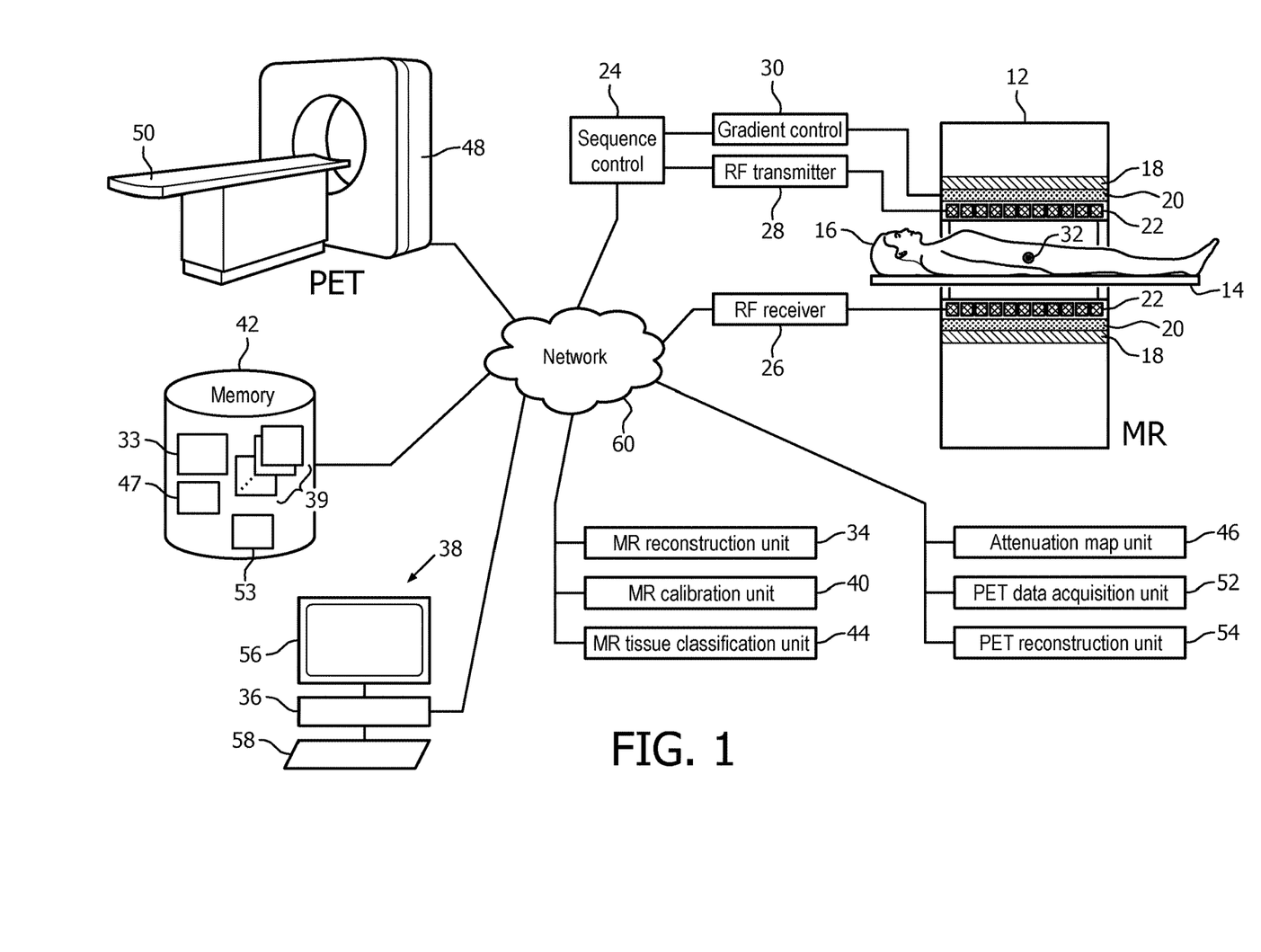
FIG. 1 schematically illustrates an embodiment of an MR/PET system with retrospective calibration for eddy currents and MR based PET attenuation correction maps.

With reference to FIG. 1, the MR/PET system 10 with retrospective calibration for eddy currents and MR based PET attenuation correction maps is schematically shown. The system 10 includes a MR scanner (or subsystem) 12 illustrated in partial cross section with a static $B_0$ main field such as a horizontal bore scanner, open system scanner, c-type scanner, vertical field scanner, and the like. The MR scanner includes a subject support 14 such as a horizontal bed or couch which supports a subject 16 and moves the subject into the MR scanner bore, static field, and field of view during imaging. The MR scanner 14 includes a main magnet 18 which generates the static main field ($B_0$) such as a horizontal main field. The MR scanner further includes one or more gradient coils 20 for applying gradient fields for manipulating resonance in the tissues of the subject. The MR scanner includes one or more RF coils 22 which generate RF pulses to excite magnetic resonance in the subject 16 such as a transmit mode and can receive resonance signals from the subject in a receive mode. In some embodiments the RF coil 22 can include a local coil.

The system 10 includes a sequence controller 24 and a RF receiver unit 26. The sequence controller controls the operation of the imaging sequence which includes a RF transmitter unit 28 controlling the operation of the RF coils 22. A gradient controller 30 controls the operation of the gradient coils 20. The communication between the controlling unit and the corresponding coils can be wired or wireless. The sequence controller provides the instructions for the RF transmitter unit 28 and the gradient controller 30 to apply a multi-echo ultra-short TE (UTE) pulse sequence with an mDixon component to the subject. One or more MR markers 32 such as vitamin E oil tubes or capsules are placed in the field of view of the bore. Preferably, elongated markers are disposed parallel to adjacent bones. The RF receiver 26 receives RF data 33 which can be stored in storage 42, e.g. MR signals indicative of the magnetic resonance excited in the tissue of the subject.

An MR reconstruction unit 34, embodied as a configured processor such as a processor 36 of a workstation 38, receives the RF data, e.g. the demodulated MR signals 33 from the RF receiver 26 and reconstructs images 39. The MR markers are used as reference for retrospectively calibrating the acquisition trajectory of the images. The MR reconstruction unit 34 reconstructs magnitude images and phase images, an in-phase image and water/fat images. A Free Induction Decay (FID) image and one or more echo images are used with the MR marker 32 references by an MR calibration unit 40 to measure the MR trajectory deviation and iteratively adjust tuning parameters. In one embodiment an In-Phase (IP) image is used with the echo image. The MR markers provide a uniform volume which is searchable in reconstructed images. The FID image typically presents strong artifact presence due to eddy currents and the like which are minimized in the echo images. The MR markers are searched for in the FID image and in the echo image, and matched between the images. The differences in shape and location between the MR markers presented FID image and the echo image are measured which provide a measure of a deviation of the k-space trajectory which is used to iteratively adjust the tuning parameters. The differences inherent in the MR data between the FID and the echo image can provide additional information to refine the measured k-space trajectory deviation. The MR reconstruction unit 34 applies the iteratively adjusted tuning parameters in reconstructing a new FID image, an Echo 1 (EC1) magnitude image, a Phase of Free Induction Decay (P_FID) image, a Phase of first echo (P1) image, and a Phase of second echo (P2) image, and with the mDixon method, the In-Phase (IP) image, the Fat image, and the Water image. The images can be stored in a memory 42 which can include local and/or solid state memory, local and/or remote disk storage, and the like. The memory can include a storage management system such as a Picture Archiving and Communication System (PACS), Departmental Radiology Information System (RIS), and the like.

An MR tissue classification unit 44 derives images with up to six or more differentiated tissue classifications from the reconstructed with iteratively adjusted tuning parameters FID, EC1, EC2, P_FID, P1, P2, IP, Fat, and Water images. The tissue classifications include cortical bone tissue, spongy bone tissue, lung tissue, body soft tissue, body fat tissue, air pockets within the body, and external air. The classifications are by voxel. The MR tissue classification unit 44 assigns attenuation values to the classified tissues.

An attenuation map unit 46 constructs an attenuation map 47 based on the classified tissues and pre-assigned attenuation values for each type of tissue. The attenuation map 47 can be stored in the memory 42. The attenuation map provides a fine granularity of tissue classifications which improves the accuracy of the attenuation computations along each LOR, and results in improve PET images.

The system can include a PET scanner 48 shown in perspective with detectors exposed or other nuclear imaging device which utilizes attenuation maps such as a Single Proton Emission Computed Tomography (SPECT) device. The PET scanner or other nuclear imaging device can be a separate device or combined with the MR scanner 12 to form a hybrid device, e.g. MR/PET scanner. The data acquisition of the PET scanner (or nuclear medicine device) and MR scanner 12 can operate simultaneously (typically both MR coils and PET detectors overlaid on the same field of view) or sequentially. The PET scanner 48 includes a subject support 50. The PET scanner includes detectors located circumferentially around an opening which receives the subject supported by the subject support 50. A PET data acquisition unit 52 records in list mode in a data store 53 the detected gamma photon emissions from the subject in a field of view within the opening. A PET reconstruction unit 54 reconstructs an image of the subject with the acquired list mode data and the constructed attenuation map 47.

The workstation 38 includes the electronic processor or electronic processing device 36, a display 56, and at least one input device 58. The display displays the reconstructed MR images, reconstructed PET images, menus, panels, and user controls, and the like. The 'display' 56 or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bistable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display. The input device 46 inputs healthcare practitioner selections. The workstation 38 can be a desktop computer, a laptop, a tablet, a mobile computing device, a smartphone, and the like. The input device 46 can be a keyboard, a mouse, a microphone, and the like. The various units 34, 40, 44, 46, 52, 54 are suitably embodied by an electronic data processing device, such as the electronic processor or electronic processing device 36 of the workstation 36, or by a network-based server computer operatively connected with the workstation 36 by a network 60, or so forth. Moreover, the reconstruction techniques, derivation techniques, and map construction are suitably implemented using a non-transitory storage medium storing instructions (e.g., software) readable by an electronic data processing device and executable by the electronic data processing device.

Figure 2:
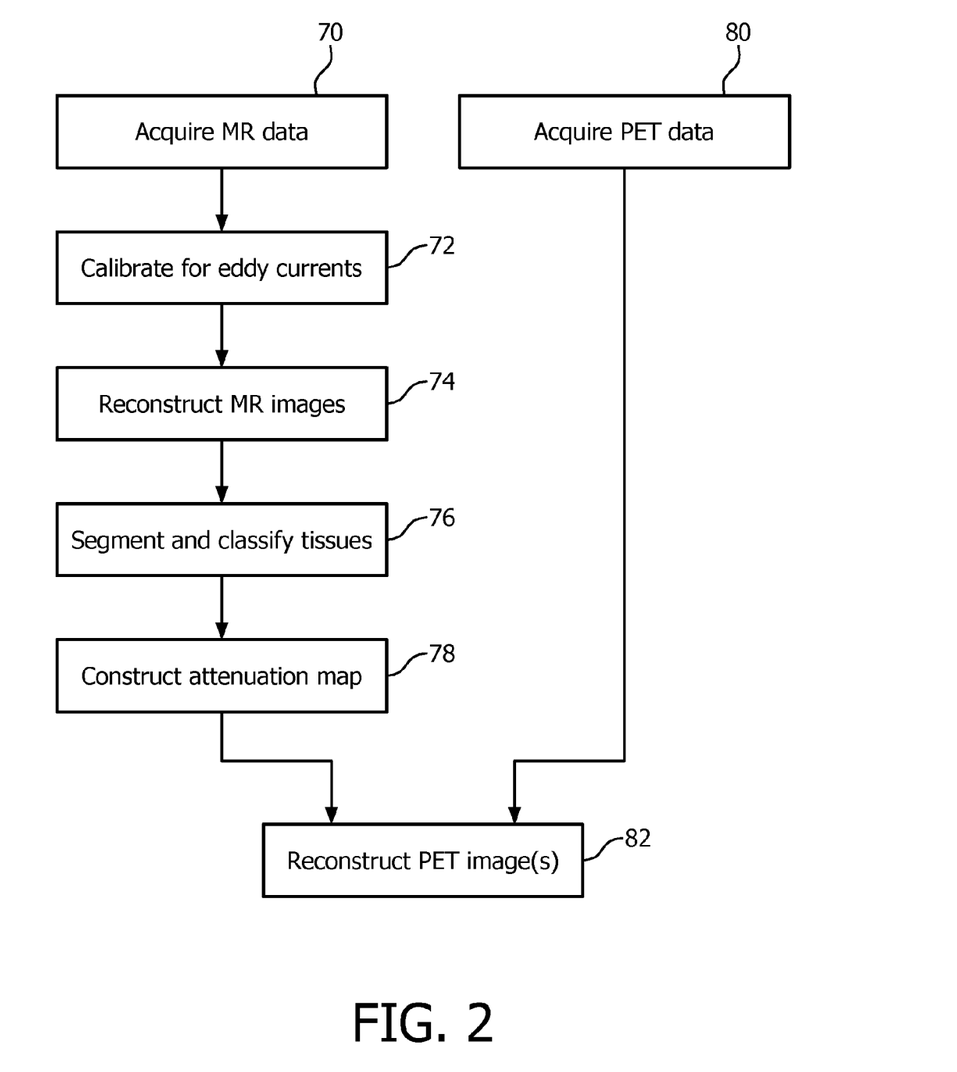
FIG. 2 flowcharts one method of using an embodiment of the MR/PET system retrospective calibration for eddy currents and MR based attenuation correction with up to six classifications.

With reference to FIG. 2, one method of using an embodiment of the MR/PET system retrospective calibration for eddy currents and MR based attenuation correction with up to six classifications is flowcharted. In a step 70, the demodulated MR data is acquired. At least two images are reconstructed from the acquired MR data in a step 72, and used to calibrate for eddy currents.

In a step 74, the calibration which corrects for eddy currents is used to reconstruct images from the acquired MR data. Tissues are segmented and classified from the reconstructed images with the calibration correction in a step 76. Attenuation values are assigned to the segmented and classified tissue in a step 78 and an attenuation map is constructed.

Simultaneously or sequentially in a step 80, PET data is acquired for the portion of the subject anatomy corresponding to the MR data, e.g. in the same field of view. The acquired PET data and the constructed attenuation map are used to reconstruct PET one or more PET images in a step 82.

Figure 3:
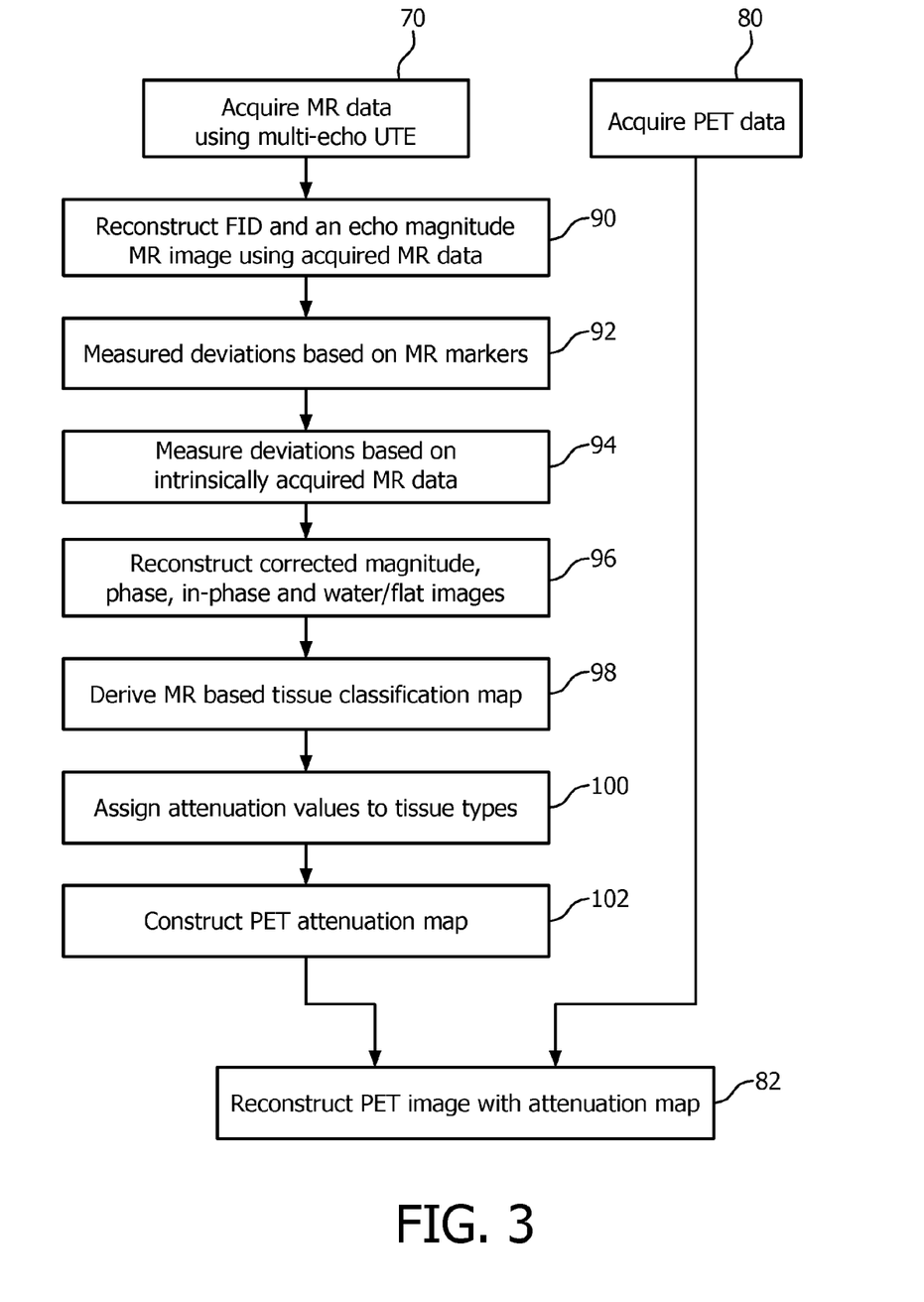
FIG. 3 flowcharts one method of using an embodiment of the MR/PET system retrospective calibration for eddy currents and MR based attenuation map construction with up to six classifications.

With reference to FIG. 3, one method of using an embodiment of the MR/PET system retrospective calibration for eddy currents and MR based attenuation correction with up to six classifications is flowcharted. In a step 70, MR data is acquired using a multi-echo UTE with mDixon pulse sequence with the MR scanner. The step includes using one or more MR markers in the field of view of the MR scanner during the MR data acquisition.

In a step 90, the FID and echo images are reconstructed from the acquired MR data. K-space trajectory deviations are measured in a step 92 using the MR markers which are present in the reconstructed FID and echo images to iteratively tune the reconstruction parameters. The size, position, and shape of the MR markers in the echo image and the FID image are used to retrospectively adjust or calibrate the tuning parameters. The measured deviation or iterative adjustment of the tuning parameters can be further refined using other intrinsic differences between the FID and echo images in a step 94 such as with the image registration.

The measured deviation or adjusted tuning parameters for all data channels are used to reconstruct a FID image corrected for the trajectory deviation in a step 96. The step further includes reconstructing the remaining images using the adjusted tuning parameters which include the EC1, EC2, P_FID, P1, P2, IP, Water, and Fat images. The IP, Water, and Fat images include reconstruction using the mDixon method.

Tissue classification images are derived in a step 98 as described in reference to FIG. 2. The tissue classification images include a bone image segmented by cortical bone and spongy bone, a lung/body image segmented by lung tissue and soft body tissue, and a water/fat image segmented by water and fat. The step can include further segmentation of air pockets internal to the body, and air external to the body.

Attenuation values are assigned for each classified tissue segment in a step 100. The attenuation values are predetermined values based on the classified tissue. The attenuation map is constructed in a step 102 from the classified tissue segments and assigned attenuation values. For example, a given voxel of the attenuation map is assigned an attenuation value for the classified tissue corresponding to that voxel based on the segmented tissues. The attenuation map can be stored in a memory or storage management system such as a PACS, RIS and the like.

PET data is acquired from the PET scanner in a step 80 in the list-mode memory. The PET data acquisition can occur simultaneously or sequentially with the MR data acquisition of step 70. One or more PET images are reconstructed from the acquired PET data and the attenuation map in a step 82. The step can include displaying the PET image on the display device and/or storing the PET image in the memory for later retrieval.

Figure 4:
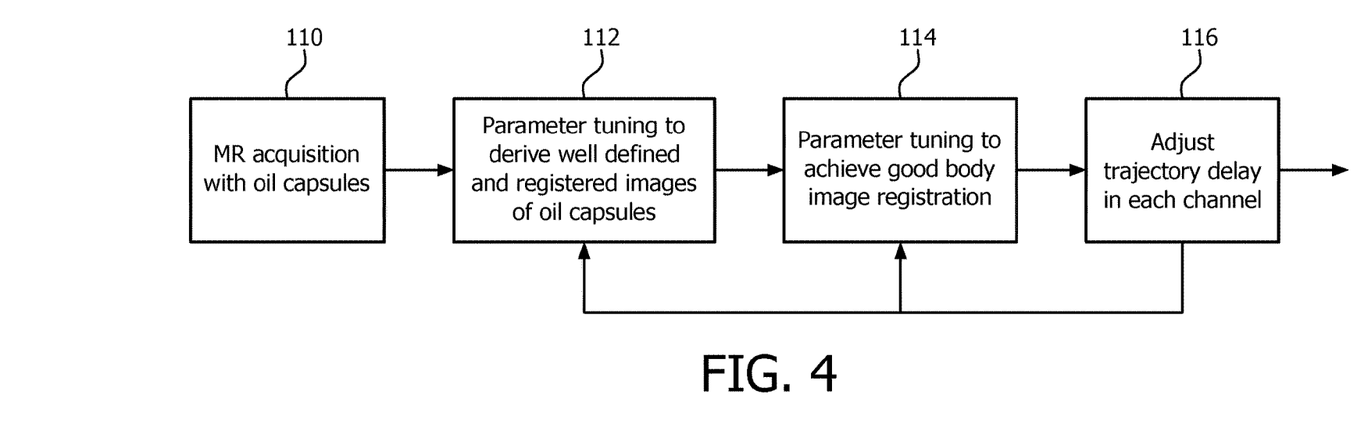
FIG. 4 flowcharts one embodiment of the retrospective trajectory delay calibration.

With reference to FIG. 4, one embodiment of the retrospective trajectory delay calibration is flowcharted. In a step 110, the MR data 33 is acquired using the multi-echo UTE with mDixon pulse sequence of the subject with the MR markers, e.g. oil capsules 32. In a step 112, the MR calibration unit 40 tunes parameters to derive well defined and registered images of the markers 32. The MR reconstruction unit 34 deploys a retrospective iterative reconstruction algorithm to reconstruct images in which the eddy current effect is dominate in one image and minimized in at least one other image. The MR markers 32 or oil capsules are placed in the field of view close to the subject throughout data acquisition. Images are reconstructed based on different trajectory delay and decay time, and the parameter combination which leads to a best image boundary and registration of the MR markers are selected as the initial values for the next step. A multi-dimensional search for trajectory delay and decay time is performed with a target function set as the absolute difference between an image with the strong eddy current presented and an image with the minimal presentation of the eddy current. In a cost function, higher weight is assigned to voxels close to the border of the body contour.

Parameter tuning is further refined to achieve good body image registration in a step 114. The body image registration can use internal landmarks such as bone, organs, vessel trees, and the like. The iterative algorithm includes all the data channels which are adjusted in a step 116 and the algorithm repeats iteratively first for the marker parameter tuning and then for the body image registration.

Figure 5:
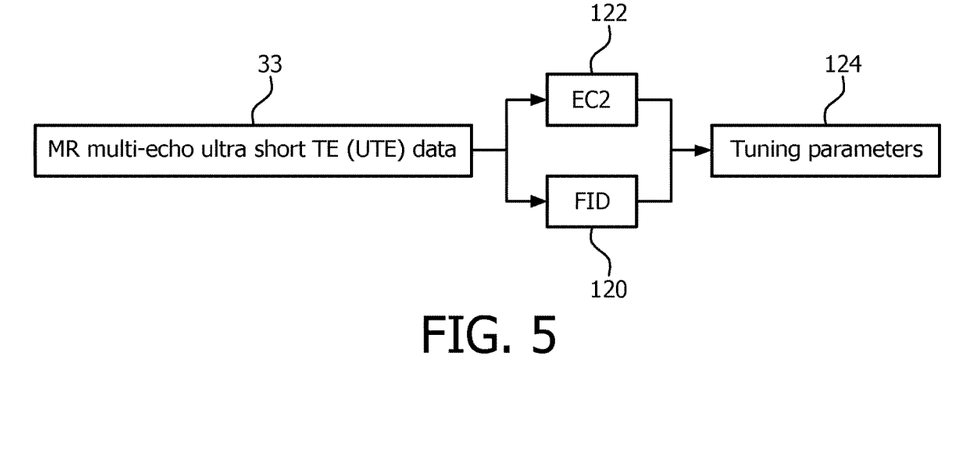
FIG. 5 schematically illustrates one embodiment of retrospective trajectory delay measurement.

With reference to FIG. 5, FIG. 5 schematically illustrates another embodiment of retrospective trajectory delay measurement. The acquired MR data 33 from the multi-echo UTE with mDixon pulse sequence is used by the MR reconstruction unit to reconstruct an image with eddy current strongly present such as a Free Induction Decay (FID) image 120 and an image with the eddy currents minimal such as an Echo 2 (EC2) image 122. The FID image 120 and the EC2 image 122 are used iteratively to generate optimal reconstruction parameters 124 which correct for the trajectory deviation and delay.

Figure 6:
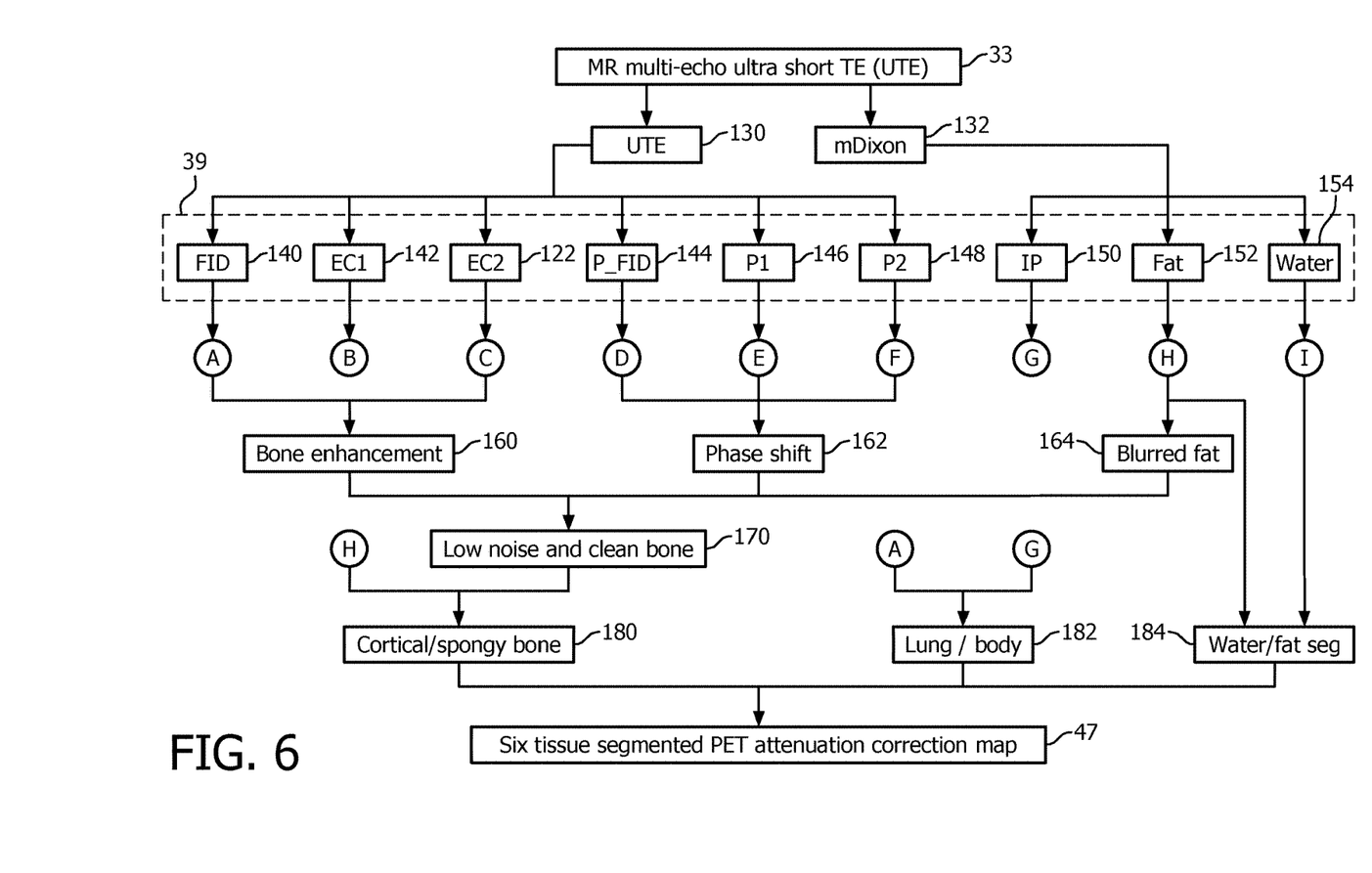
FIG. 6 schematically illustrates one embodiment of MR based PET attenuation correction map derivation with six classifications.

With reference to FIG. 6, one embodiment of MR based PET attenuation correction map derivation with six classifications is schematically illustrated. The demodulated MR signals 33 are received from the RF receiver 26 from a single pulse sequence which includes the multi-echo UTE and mDixon component. The MR reconstruction unit 34 reconstructs the magnitude and phase images using the UTE data component 130 of the demodulated MR signals 33 and the in-phase, water, and fat images using the mDixon component 132 of the demodulated MR signals 33. The MR reconstruction unit 34 reconstructs with the tuned parameters based on the measured deviation, the FID image 140, the EC1 image 142, the P_FID image 144, the P1 image 146, the P2 image 148, the IP image 150, the Fat image 152, and the Water image 154 as discussed in reference to FIG. 1. The nine reconstructed images provide the source images for the derivation of the classified tissues.

The MR tissue classification unit 44 constructs a bone enhancement image 160 by subtracting one of the echo images, such as the EC2 image 122, from the FID image 140, and then normalizing the result. A phase shift image 162 is constructed by subtracting the P_FID image 144 from the P1 image 146, subtracting the P1 image 146 from the P2 image 148, and then computing an average of the two differences at each voxel. The phase shift image 162 includes the phase shift due to magnetic susceptibility. The MR tissue classification unit 44 constructs a blurred fat image 164 by passing the Fat image 152 through a smoothing filter. The smoothing of the fat image uses the high fat content of bone marrow to delineate between cortical bone and spongy bone.

The MR tissue classification unit 44 constructs a low noise and clean bone image 170 using the blurred fat image 164. The blurred fat image 164 provides a template or mask of search areas in the blurred fat which include either of bone marrow or body fat. Within the search areas, the bone enhancement image 160 exhibits higher signal intensity for bone tissue, and similarly the phase shift image 162 exhibits a larger shift or higher signal intensity in bone tissue. Weights are assigned to the bone enhancement image 160 and the phase shift image 162 based on a training data set, e.g. regression analysis of the predictive value of each voxel in the bone enhancement image and phase shift image across multiple samples. The weights are used to compute a function of the weighted voxels within the search areas for the resulting low noise and clean bone image 170. The clean and low noise bone image 120 presents an accurate image of cortical bone.

The MR tissue classification unit 44 segments cortical bone from spongy bone based on a combination of the low noise and clean bone image 170 and the Fat image 152 in a cortical/spongy bone image 180. Spongy bone includes fat areas surrounded by cortical bone.

The MR tissue classification unit 44 segments lung tissue from soft body tissue using a combination of the FID image 140 and the IP image 150. The segmentation of lung tissue uses a weighting of the FID image 140 and a separate weighting of the IP image 150 to create a segmented lung tissue in a lung/body image 182. Alternatively for the construction of the segmented lung/body image can include the IP image 150 and/or one or more of the FID image 140, the Fat image 152, or the Water image 154, e.g. each image is assigned a weight and the resulting classification is a predicted value from the weighting or regression coefficients. The water and fat in the subject are classified in a water/fat segmented image 184 using a combination of the Water image 154 and the Fat image 152.

The MR tissue classification unit 44 assigns an attenuation value to each classified tissue which includes cortical bone, spongy bone, lung tissue, soft body tissue, body fat, water, air pocket inside the body, and/or air external to the body. The attenuation unit 46 constructs the attenuation map 47 which is a union of assigned attenuation values based on the various segmented tissue images in the cortical/spongy bone image 180, the lung/soft body tissue image 182, and the water/fat segmented image 184. For example, each voxel representing a classified tissue is assigned an attenuation value, and the map 47 includes all the assigned attenuation values, e.g., each voxel includes the assigned attenuation value according the classified tissue for that voxel.

It is to be appreciated that in connection with the particular illustrative embodiments presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that particular elements or components described herein may have their functionality suitably implemented via hardware, software, firmware or a combination thereof. Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to preferred embodiments. Obviously, modifications and alterations will occur to others upon reading and understanding the present specification. It is intended that the invention be construed as including all such modifications and alterations insofar as they come within the scope of the appended claims or the equivalents thereof. That is to say, it will be appreciated that various of the above-disclosed and other features and functions, or alternatives thereof, may be desirably combined into many other different systems or applications, and also that various presently unforeseen or unanticipated alternatives, modifications, variations or improvements therein may be subsequently made by those skilled in the art which are similarly intended to be encompassed by the following claims.

What is claimed is:

1. A medical imaging system comprising:
a magnetic resonance (MR) scanner which applies a multi-echo ultra-short echo time (UTE) with an mDixon pulse sequence to a subject and receives MR data representing at least a portion of the subject; and
one or more processors configured to:
reconstruct a free induction decay (FID) image, one or more echo magnitude images, one or more phase images, an in-phase image (IP), a water image, and a fat image from the received MR data, and
at least one of:
segment and classify cortical bone and spongy bone from the reconstructed magnitude, phase, and fat images, or
segment and classify lung tissue, soft body tissue, water, and fat from the reconstructed magnitude, phase, water, and fat images.

2. The system according to claim 1, wherein the reconstructed images further include an ECho 1 (EC1) image, an ECho 2 (EC2) image, a Phase Free Induction Decay (P_FID) image, a Phase 1 (P1) image, a Phase 2 (P2) image, and/or an In-Phase (IP) image.

3. The system according to claim 1, wherein the one or more processors is further configured to:
construct an attenuation map based on the segmented and classified tissues and assigned attenuation values;
wherein the MR tissue classification unit assigns an attenuation value to each of the segmented and classified tissues.

4. The system according to claim 1, wherein the one or more processors is further configured to:
construct a bone enhanced image by normalizing one of the one or more echo magnitude images subtracted from a free induction decay (FID) image, and a phase shift image by an average of a phase free induction decay ($P_{13}FID$), image subtracted from a first phase (P1) image and the P1 image subtracted from a second phase (P2) image,
construct a blurred fat image by blurring the fat image with a filter,
construct a low noise and clean bone image based on a weighted combination of the constructed bone enhanced image, the phase shift image, and the blurred fat image, and
segment and classify cortical bone from spongy bone based on the low noise and clean bone image.

5. The system according to claim 1, wherein the one or more processors are further configured to segment and classify lung tissue from soft body tissue in the lung/soft body tissue image based on a weighted combination of the FID image and the in-phase (IP) image.

6. The system according to claim 1, wherein the one or more processors are further configured to segment and classify water from fat in a water/fat image based on the fat image, and the water image.

7. A medical imaging system comprising:
at least one marker which is magnetically resonant in a magnetic field;
a magnetic resonance (MR) scanner which applies a multi-echo ultra-short TE (UTE) with mDixon pulse sequence to a subject and receives MR data representing at least a portion of the subject; and
one or more processors configured to:
reconstruct a free induction decay (FID) image, one or more echo magnitude images, one or more phase images, an in-phase image, a water image, and a fat image from the received MR data, and
iteratively adjust reconstruction parameters based on the at least one marker in the FID image and in the one or more echo magnitude images.

8. The system according to claim 7, wherein the iteratively adjusted reconstruction parameters are based on a difference of at least one of a size and shape of the at least one marker between the one or more echo magnitude images and the FID image.

9. A method of medical imaging, comprising:
receiving magnetic resonance (MR) data representing at least a portion of a subject based on an applied multi-echo ultra-short TE (UTE) with mDixon pulse sequence to the subject with a MR scanner;
reconstructing a Free Induction Decay (FID) image, and one or more echo magnitude images, one or more phase images, an in-phase image, a water image, and a fat image from the received MR data; and
at least one of:
segmenting and classifying cortical bone and spongy bone from the reconstructed magnitude, phase, and fat images,
segmenting and classifying lung tissue, soft body tissue, water, and fat from the reconstructed magnitude, phase, water, and fat images.

10. The method according to claim 9, wherein the reconstructed images further include an ECho 1 (EC1) image, an ECho 2 (EC2) image, a Phase Free Induction Decay (P_FID) image, a Phase 1 (P1) image, and a Phase 2 (P2) image.

11. The method according to claim 9, further including:
assigning an attenuation value to each of the segmented and classified tissues,
constructing an attenuation map based on the segmented and classified tissues, and the assigned attenuation values.

12. The method according to claim 11, further including:
acquiring nuclear imaging data of the subject from a nuclear imaging device;
reconstructing one or more images of the subject based on the acquired nuclear imaging data and the reconstructed attenuation map.

13. A non-transitory computer-readable storage medium carrying software which controls one or more electronic data processing devices to perform the method according to claim 9.

14. An electronic data processing device configured to perform the method according to claim 9.

15. A method of medical imaging comprising:
receiving magnetic resonance (MR) data representing at least a portion of a subject based on an applied multi-echo ultra-short TE (UTE) with mDixon pulse sequence to the subject with a MR scanner;
reconstructing a Free Induction Decay (FID) image, and one or more echo magnitude images, one or more phase images, a water image, and a fat image from the received MR data;
iteratively adjusting the reconstruction parameters based on at least one of a size, position, and shape of at least one marker between the one or more echo magnitude images and the FID image; and
wherein receiving includes the at least one marker which is magnetically resonant in a magnetic field and represented in the received data.

16. A non-transitory computer-readable storage medium carrying software which controls one or more electronic data processing devices to perform the method according to claim 15.

17. An electronic data processing device configured to perform the method according to claim 15.

* * * * *